(12) United States Patent
Morisson

(10) Patent No.: US 7,391,352 B2
(45) Date of Patent: Jun. 24, 2008

(54) COMPARISON CIRCUIT FOR ANALOG/DIGITAL CONVERTER

(75) Inventor: Richard Morisson, Grenoble (FR)

(73) Assignee: Atmel Grenoble (FR)

( * ) Notice: Subject to any disclaimer, the term of this patent is extended or adjusted under 35 U.S.C. 154(b) by 41 days.

(21) Appl. No.: 10/575,273

(22) PCT Filed: Oct. 13, 2004

(86) PCT No.: PCT/EP2004/052518

§ 371 (c)(1),
(2), (4) Date: Apr. 11, 2006

(87) PCT Pub. No.: WO2005/036754

PCT Pub. Date: Apr. 21, 2005

(65) Prior Publication Data

US 2007/0241953 A1    Oct. 18, 2007

(30) Foreign Application Priority Data

Oct. 17, 2003   (FR)   ................................. 03 12182

(51) Int. Cl.
*H03M 1/12* (2006.01)

(52) U.S. Cl. ....................................... 341/155; 341/159

(58) Field of Classification Search .................. 341/155, 341/159, 162, 154
See application file for complete search history.

(56) References Cited

U.S. PATENT DOCUMENTS 5,517,134 A * 5/1996 Yaklin .......................... 327/65
6,169,510 B1   1/2001 Bult et al.

OTHER PUBLICATIONS

Choi M et al "A 6b 1.3GSample/s A/D converter in 0.35/spl mu/m CMOS" IEEE Journal of Solid State Circuits, Dec. 2001, pp. 1847-1858.
Figures 2,13,15 p. 1847, colonne 2, ligne 27- p. 1848, colonne 1, ligne 16 p. 1851, colonne 2, ligne 40-p. 1852, cologne 2, ligne 8.
Leuciuc A et al: "Active Spatial filtering for A/D Converters" IEEE International Symposium on Circuits and Systems, vol. 2, May 26, 2002-May 29, 2002 pp. 11 392-11 395, figures 1, 2, 9 p. 393, colonne 2, ligne 1-p. 394, colonne 1, ligne 32.

* cited by examiner

*Primary Examiner*—Peguy JeanPierre
(74) *Attorney, Agent, or Firm*—Lowe Hauptman Ham & Berner, LLP

(57) ABSTRACT

The invention pertains to a comparison circuit for an analog/digital converter. In order to reduce the effect of the offset voltages of the various comparators of the comparison circuit, voltage followers and a resistor network delivering at its outputs, mean voltages that are the average of those present on outputs of the comparators are linked downstream of the outputs of the comparators.

4 Claims, 2 Drawing Sheets

US 7,391,352 B2

COMPARISON CIRCUIT FOR ANALOG/DIGITAL CONVERTER

CROSS REFERENCE TO RELATED APPLICATIONS

The present Application is based on International Application No. PCT/EP2004/052518, filed on Oct. 13, 2004, which in turn corresponds to French Application No 0312182, filed on Oct. 17, 2003, and priority is hereby claimed under 35 USC §119 based on these applications. Each of these applications are hereby incorporated by reference in their entirety into the present application.

BACKGROUND OF THE INVENTION

The invention pertains to a comparison circuit for an analog/digital converter. The comparison circuit comprises a network of comparators each comparing an analog voltage to be converted with a reference voltage. The analog voltage to be converted generally arises from a sample-and-hold module allowing the whole assembly of comparators of the network to receive the same analog voltage at the moment at which they perform the comparison with the reference voltage.

The reference voltages received by the comparators are distributed over a range in which the analog voltage can vary. The distribution is generally uniform over the range and it is for example obtained by means of a network of resistors, all of like value and linked in series between the terminals of a source of supply voltage of the comparator. There are substantially as many resistors as comparators. The reference voltages are then tapped off at the various inter-resistor junction points.

Each comparator comprises two outputs, one direct and the other inverse. The voltages present on its outputs are dependent on the potential difference between the analog voltage and the reference voltage received by the comparator concerned. FIG. 1 represents three curves showing the variation in the voltage present on the direct output On−1, On and On+1 as a function of the analog voltage V, for three comparators C of rank n−1, n and n+1 in the network of comparators. These three comparators receive respectively reference voltages Vref n−1, Vref n and Vref n+1. The comparators receive reference voltages similar in their distribution over the range.

For a given comparator, for example the comparator of rank n, if its response were perfect, the voltage On present on its direct output ought to be zero when the analog voltage V is equal to the reference voltage Vn. However, the response of the comparators is not perfect and a voltage mismatch, termed the offset voltage, is noted between the reference voltage Vref n and the analog voltage V causing a zero voltage On on the direct output of the comparator of rank n. In practice it is noted that each comparator C has its own offset voltage independent of that of the other comparators. In FIG. 1, the comparator C of rank n−1 has an offset voltage Offset n−1, the comparator C of rank n has an offset voltage Offset n and the comparator C of rank n+1 has an offset voltage Offset n+1. The offset voltages may be negative or positive. Their values are randomly distributed for the various comparators of an analog/digital converter. These offset voltages impair the accuracy of the converter and it is noted that they tend to increase when the size of the electronic component on which the converter is made is reduced.

Additionally, the resolution LSB of an analog digital converter may be expressed by the mismatch in the analog voltage modifying the value of a low-order bit at the output of the converter. The LSB resolution is expressed as follows:

$$LSB = \frac{Vpeak/peak}{2^n}$$

where Vpeak/peak represents the maximum amplitude of the analog voltage that the converter can convert, and where n is the number of comparators in the network. If the resolution LSB is less than three times the offset voltage, there is a loss of linearity of the converter and the low-order bit is no longer meaningful.

SUMMARY OF THE INVENTION

The aim of the invention is to reduce the effects of these offset voltages by averaging them over neighboring converters. This reduction makes it possible to improve the resolution of the converter.

Accordingly, the subject of the invention is a comparison circuit for an analog/digital converter comprising a network of comparators each comparing an analog voltage to be converted with a reference voltage, the reference voltages being distributed over a range in which the analog voltage can vary, each comparator comprising a direct output and an inverse output, characterized in that each output, direct or inverse, is linked to the input of a voltage follower, the outputs of each voltage follower being connected either to inputs of a first network of resistors delivering at its outputs, mean voltages that are the average of those present on direct outputs of the comparators receiving reference voltages similar in their distribution over the range, or to inputs of a second network of resistors delivering at its outputs, mean voltages that are the averages of those present on inverse outputs of comparators receiving reference voltages similar in their distribution over the range.

BRIEF DESCRIPTION OF THE DRAWING

The invention will be better understood and other advantages will become apparent on reading the detailed description of an embodiment given by way of example and illustrated by the appended drawing in which.

DETAILED DESCRIPTION OF THE PREFERRED EMBODIMENT

Figure 1:
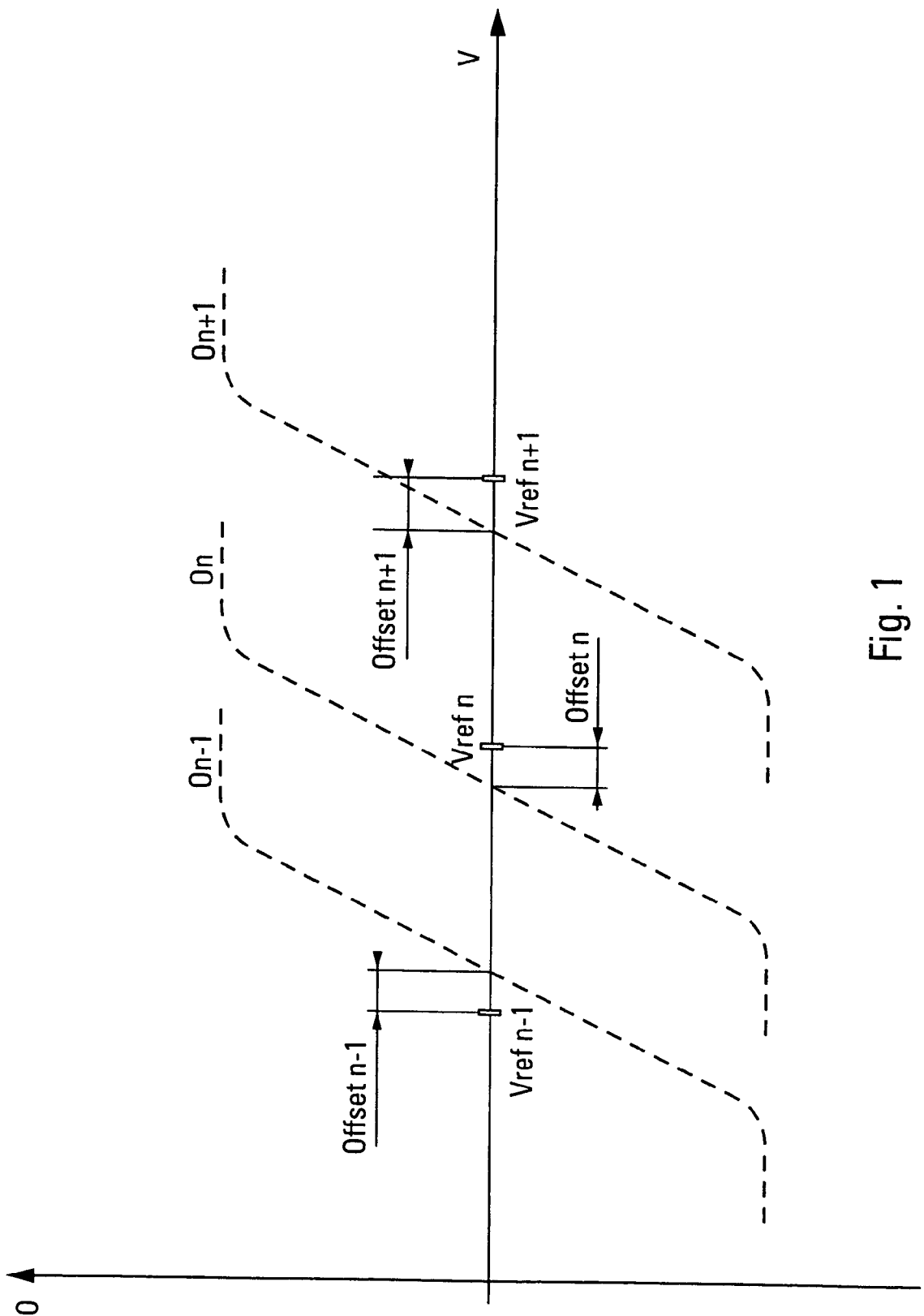
FIG. 1 represents several curves showing the variation of the voltage present on the direct outputs of comparators as a function of the analog voltage V which is applied to it; this figure has already been commented on above.
Figure 2:
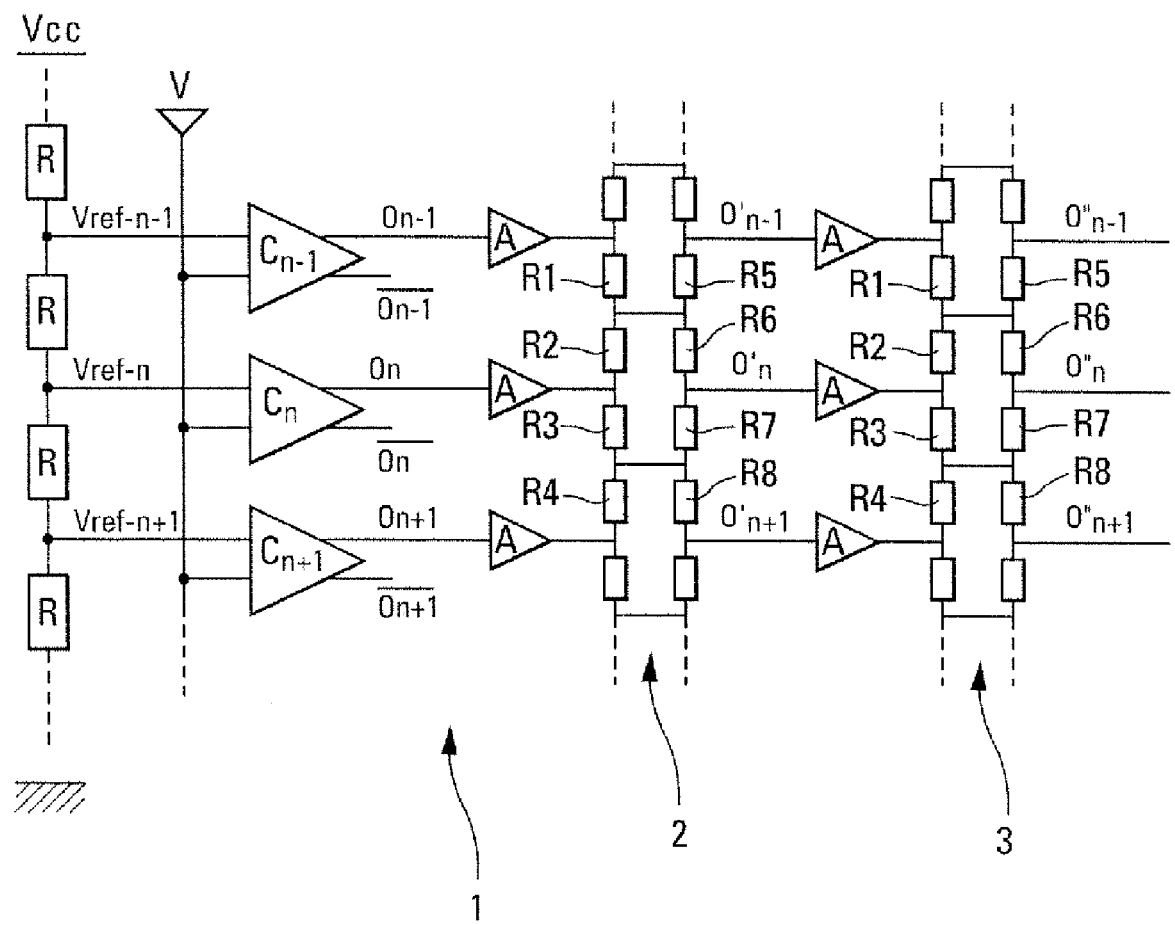
FIG. 2 represents a comparison circuit comprising several networks of resistors making it possible to carry out the averaging of voltages of direct outputs of several neighboring comparators.

FIG. 2 represents a comparison circuit 1 comprising a network of comparators each comparing an analog voltage V to be converted with a reference voltage. In FIG. 2, three comparators Cn−1, Cn and Cn+1 have been represented, n representing their rank in the network of comparators. Each comparator comprises two inputs and the analog voltage V is present on one of these inputs. The other input receives a reference voltage specific to each comparator C. The three comparators Cn−1, Cn and Cn+1 respectively receive reference voltages Vref n−1, Vref n and Vref n+1 obtained by means of a network of resistors R, all linked in series between the terminals of a source of supply voltage Vcc of the comparator. Each comparator Cn−1, Cn or Cn+1 comprises two outputs, one direct, respectively On−1, On or On+1, the other inverse respectively $\overline{On-1}$, $\overline{On}$ or $\overline{On+1}$. The voltages present on its outputs are dependent on the potential difference between the analog voltage V and the reference voltage Vref n−1, Vref n or Vref n+1 received by the comparator C concerned. The voltages present on the outputs of the various comparators C vary, for example, as represented in FIG. 1. For a given comparator C, the voltage present on the inverse output $\overline{O}$ is equal to the voltage symmetric to the voltage present on its direct output O with respect to a mean voltage which it delivers.

Each output, direct On−1, On or On+1 or inverse $\overline{On-1}$, $\overline{On}$ or $\overline{On+1}$, is linked to the input of a voltage follower A. Each voltage follower A delivers a voltage equal to the voltage present on that output of the comparator to which it is linked and has a very low output impedance.

The outputs of each voltage follower A are connected either to an input of a first network 2 of resistors delivering at its outputs O'n−1, O'n and O'n+1, mean voltages that are the average of those present on the direct outputs of the comparators Cn−1, Cn and Cn+1, or to an input of a second network of resistors delivering at its outputs $\overline{O'n-1}$, $\overline{O'n}$ and $\overline{O'n+1}$, mean voltages that are the average of those present on the inverse outputs of the comparators Cn−1, Cn and Cn+1. So as not to overburden FIG. 2 only the first network 2 of resistors has been represented. Advantageously the two networks of resistors have the same structure.

Advantageously, each network of resistors comprises a first series assembly of two identical pairs of two identical resistors in series, R1, R2, on the one hand, R3, R4 on the other hand, and a second series assembly of two identical pairs of two identical resistors in series R5, R6 on the one hand, R7, R8 on the other hand. The inputs of the network of resistors are constituted by the ends and the midpoint of the first series assembly, and the outputs of the network of resistors are constituted by the ends and the midpoint of the second series assembly, the midpoint of the first pair and of the second pair of resistors of the first assembly are connected respectively to the midpoint of the first pair and of the second pair of the second assembly. This structure of network of resistors is repeated so as to be able to link up to the outputs of all the comparators C and thus provide as many outputs O' of the network of resistors as outputs O of the comparators C.

The transfer function of the output O'n of the first network 2 can then be expressed in the following manner:

$$O'n = \frac{\frac{On + On + 1}{2} + \frac{On + On - 1}{2}}{2}$$

The first two networks of resistors make it possible to reduce the statistical error due to the various offset voltages of the comparators. More precisely, it is possible to determine the standard deviation a of the offset voltages of the assembly of comparators C of the network. It is possible, with the aid of the transfer function of the first resistor network to determine an equivalent standard deviation σ' of the comparators as seen from the outputs of the first network 2 of resistors. The equivalent standard deviation σ' may be expressed in the following manner:

σ'=σmt;epmrl;√⅜rlxmx≈0.6σ

This reduction in the effect of the offset voltage of the comparators makes it possible practically to improve the resolution by a low-order bit.

The combination of the voltage followers A with the network of resistors makes it possible not to lose gain at the output of the network of resistors with respect to the output of the network of comparators. In the absence of a voltage follower A, the reduction in the effect of the offset voltage of the comparators would be lower.

Advantageously the outputs O'n−1, O'n and O'n+1 of the first network 2 of resistors are connected, by way of voltage followers A, to inputs of a third network 3 of resistors delivering to its outputs O"n−1, O"n and O"n+1 mean voltages that are the average of those present on neighboring inputs of the third network of resistors. Likewise, the outputs $\overline{O'n-1}$, $\overline{O'n}$ and $\overline{O'n+1}$ of the second network of resistors are connected, by way of voltage followers A, to inputs of a fourth network of resistors delivering at its outputs $\overline{O"n-1}$, $\overline{O"n}$ or $\overline{O"n+1}$, mean voltages those present on neighboring inputs of the fourth network of resistors. As before, so as not to overburden FIG. 2, the fourth network of resistors is not represented. Advantageously, the four networks of resistors have the same structure. The transfer function of the output O"n of the second network 3 of resistors can be expressed in the following manner:

$$O''n = \frac{\frac{O'n + O'n + 1}{2} + \frac{O'n + O'n - 1}{2}}{2}$$

As before, an equivalent standard deviation σ" can be expressed in the following manner:

σ"=σ'√⅜=σ√⅜×√⅜≈0.36σ

An appreciable decrease in the effect of the offset voltage of the comparators C can be seen here, this decrease being obtained with the aid of the second stage of network of resistors. The voltage followers A connected between the two networks of resistors avoid any loss of gain. The invention could be generalized by chaining together other networks of resistors, decorrelated from the previous networks by means of voltage followers, downstream of the two described here. Nevertheless, this chaining appreciably increases the number of components present on a substrate on which the analog digital converter is made.

The invention can be implemented in respect of a comparison circuit architecture comprising comparators all working in parallel. This architecture is well known in the literature by the name "flash". The invention may also be implemented in respect of a so-called "folding" comparison circuit architecture comprising a smaller number of comparators working in parallel. These comparators are then used several times over the range. This architecture is well known in the literature.

It will be readily seen by one of ordinary skill in the art that embodiments according to the present invention fulfill many of the advantages set forth above. After reading the foregoing specification, one of ordinary skill will be able to affect various changes, substitutions of equivalents and various other aspects of the invention as broadly disclosed herein. It is therefore intended that the protection granted hereon be limited only by the definition contained in the appended claims and equivalents thereof.

The invention claimed is:

1. A comparison circuit for an analog/digital converter comprising:

a network of comparators each comparing an analog voltage to be converted with a reference voltage (Vref), the reference voltages being distributed over a range in which the analog voltage can vary, each comparator comprising a direct output and an inverse output, wherein each output, direct or inverse, is linked to the input of a voltage follower, the outputs of each voltage follower being connected either to inputs of a first network of resistors delivering at its outputs, mean voltages that are the average of those present on direct outputs of the comparators receiving reference voltages similar in their distribution over the range, or to inputs of a second network of resistors delivering at its outputs, mean voltages that are the averages of those present on inverse outputs of comparators receiving reference voltages similar in their distribution over the range.

2. The comparison circuit as claimed in claim 1, wherein the outputs of the first network of resistors are connected, by way of voltage followers, to inputs of a third network of resistors delivering at its outputs, mean voltages that are the averages of those present on neighboring inputs of the third network of resistors, and wherein the outputs of the second network of resistors are connected, by way of voltage followers, to inputs of a fourth network of resistors delivering at its outputs, mean voltages that are the averages of those present on neighboring inputs of the fourth network of resistors.

3. The comparison circuit as claimed in claim 1, wherein the networks of resistors have the same structure.

4. The comparison circuit as claimed in claim 3, wherein each network of resistors comprises a first series assembly of two identical pairs of two identical resistors in series, and a second series assembly of two identical pairs of two identical resistors in series and wherein the inputs of the network of resistors are constituted by the ends and the midpoint of the first series assembly, and the outputs of the network of resistors are constituted by the ends and the midpoint of the second series assembly, the midpoint of the first pair and of the second pair of resistors of the first assembly are connected respectively to the midpoint of the first pair and of the second pair of the second assembly.

* * * * *